United States Patent
Huor

(12) 
(10) Patent No.: US 6,552,631 B2
(45) Date of Patent: Apr. 22, 2003

(54) RESONATOR-TYPE SAW FILTER WITH INDEPENDENT GROUND PATTERNS FOR INTERDIGITAL TRANSDUCERS AND REFLECTORS

(75) Inventor: Ou Hok Huor, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/814,029

(22) Filed: Mar. 22, 2001

(65) Prior Publication Data

US 2002/0000897 A1 Jan. 3, 2002

(30) Foreign Application Priority Data

Jun. 30, 2000 (JP) .................................... 2000-198119

(51) Int. Cl.[7] ................................................ H03H 9/64
(52) U.S. Cl. ..................................... 333/195; 310/313
(58) Field of Search ............................... 333/17, 28 R, 333/19, 18 R

(56) References Cited

U.S. PATENT DOCUMENTS 4,438,417 A * 3/1984 Yamashita et al. .......... 333/193
5,966,060 A * 10/1999 Ikada ....................... 310/313 B
6,025,763 A * 2/2000 Morimoto ................ 310/313 C

FOREIGN PATENT DOCUMENTS

| JP | 10-093381 | 4/1998 |
|---|---|---|
| JP | 10-173469 | 6/1998 |
| JP | 10-294640 | 11/1998 |

* cited by examiner

Primary Examiner—Barbara Summons
(74) Attorney, Agent, or Firm—Venable; Michael A. Sartori

(57) ABSTRACT

A resonator-type SAW filter has a ladder network of SAW resonators with respective interdigital transducers and reflectors. Individual ground patterns are provided for each interdigital transducer and each reflector in the shunt-arm SAW resonators. These ground patterns are electrically isolated from one another, and are grounded through separate bonding wires or other conductors that couple the ground patterns to a ground lead. This independent grounding scheme is found to improve the attenuation characteristic of the filter on the low side of the passband.

10 Claims, 15 Drawing Sheets

13a

13a

RESONATOR-TYPE SAW FILTER WITH INDEPENDENT GROUND PATTERNS FOR INTERDIGITAL TRANSDUCERS AND REFLECTORS

BACKGROUND OF THE INVENTION

The present invention relates to a surface-acoustic-wave bandpass filter, more particularly to a filter structure that improves the lower stopband attenuation of the filter.

Surface-acoustic-wave filters (hereinafter, SAW filters) exemplifying the prior art are described in Japanese Unexamined Patent Applications 10-93381, 10-173469, and 10-294640.

SAW devices in general have an interdigital transducer (IDT) that excites a surface acoustic wave on a piezoelectric substrate. The interdigital transducer can be designed to give the SAW device various characteristics and functions, the filtering function being among the most important. In the past, SAW filters in which surface acoustic waves propagated between two or more interdigital transducers were predominant, but much recent research has focused on SAW filters of the resonator type.

A SAW resonator. has a single interdigital transducer, and may have reflectors to keep surface acoustic waves from escaping from the interdigital transducer. The impedance characteristics of a SAW resonator are quite similar to those of an inductor-capacitor (LC) resonator, so a SAW filter comprising SAW resonators can be designed by classical methods of electrical filter design.

In the past, however, there has been a trade-off between insertion loss in the passband and attenuation in the stopbands, making it difficult to obtain a SAW filter that combines low passband insertion loss with high out-of-band attenuation, particularly in the lower stopband. Further details will be given below.

SUMMARY OF THE INVENTION

An object of the present invention is to improve the attenuation in the lower stopband of a SAW filter, without increasing the insertion loss in the passband.

The invented SAW filter has a plurality of SAW resonators with respective interdigital transducers and reflectors, coupled in a ladder network having at least one series-arm. SAW resonator and at least one shunt-arm SAW resonator. The filter also has a plurality of ground patterns, including a separate ground pattern connected to each interdigital transducer of each shunt-arm SAW resonator, and a separate ground pattern connected to each reflector of each shunt-arm SAW resonator. These ground patterns are electrically isolated from one another, and are independently grounded by a plurality of conductors that couple the ground patterns to at least one ground lead.

Independent grounding of the interdigital transducer and reflectors of each shunt-arm SAW resonator is found to improve the attenuation characteristic. of the filter on the low side of the passband.

DETAILED DESCRIPTION OF THE INVENTION

Embodiments of the invention will be described with reference to the attached drawings, following a further description of the prior art and the problems addressed by the invention.

Figure 1:
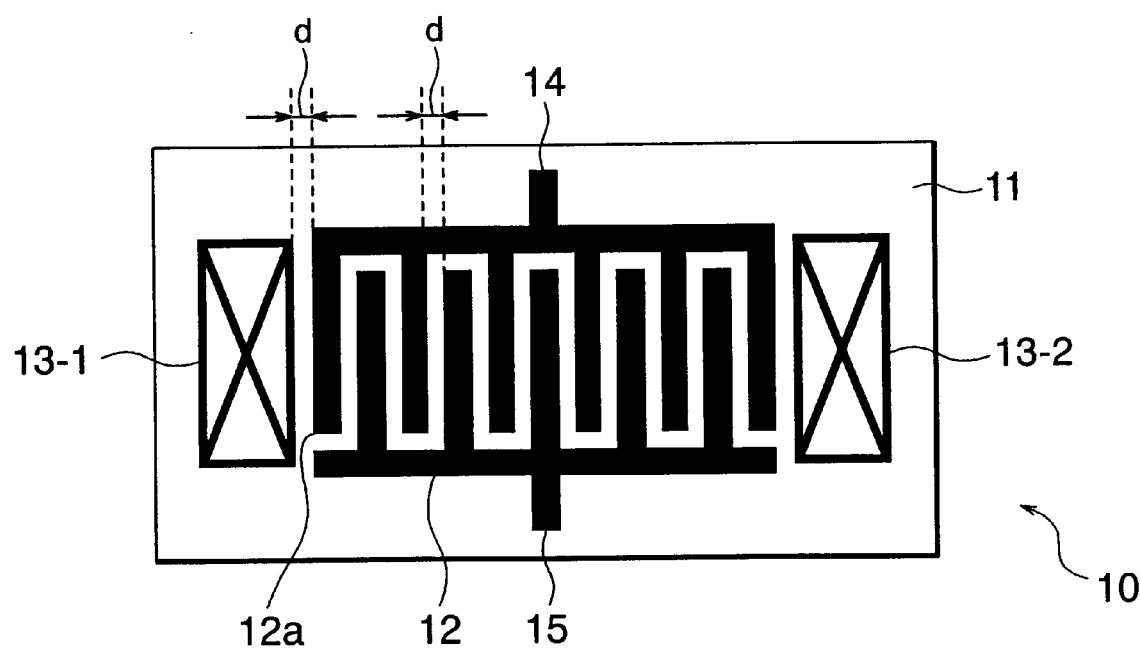
FIG. 1 shows a plan view of a prior art SAW resonator.

FIG. 1 shows a SAW resonator 10 having a piezoelectric substrate 11 made of, for example, lithium tantalate ($LiTaO_3$), lithium niobate ($LiNbO_3$), or crystalline quartz. A metal film is deposited on the piezoelectric substrate 11 and patterned to form an interdigital transducer 12 with a plurality of electrode fingers 12a, a pair of reflectors 13-1, 13-2, disposed on both sides of the interdigital transducer 12, an input terminal 14, and an output terminal 15. The reflectors 13-1, 13-2 are separated from the interdigital transducer 12 by a distance 'd.' The reflectors on one or both sides may be omitted if they are not needed.

Figure 2A:
FIGS. 2A, 2B, and 2C show the reflector symbol and two types of reflectors that can be employed in prior art FIG. 1.
Figure 2B:
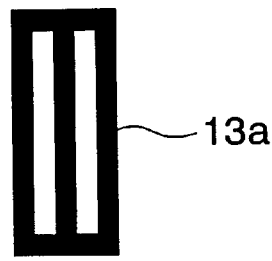
Figure 2C:
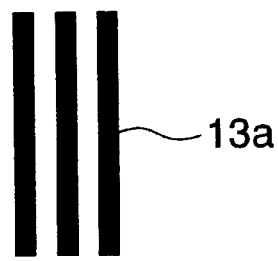

The general symbol for a reflector, illustrated separately in FIG. 2A, may denote various types of reflectors; the two main types are shown in FIGS. 2B and 2C. The reflector in FIG. 2B has, for example, fifty to one hundred electrode fingers 13a which are interconnected so that the entire reflector is short-circuited. The reflector in FIG. 2C is similar except that the electrode fingers 13a are completely disconnected from one another; the electrode fingers are open-circuited. Both types of reflectors affect SAW filter characteristics in substantially the same way.

When present, the reflectors 13-1, 13-2 can be placed at various distances 'd' from the interdigital transducer 12 in order to obtain a desired impedance. The distance 'd' is generally made equal to substantially one-quarter of the wavelength of the surface acoustic wave excited by the interdigital transducer 12; this is also the separation between adjacent electrode fingers 12a in the interdigital transducer.

The interdigital transducer 12 and reflectors 13-1, 13-2 are formed in the same fabrication process step, so they have the same film thickness, and are made of the same material. The film thickness is typically a few hundred angstroms or a few thousand angstroms. The film material is usually aluminum, or an alloy having aluminum as its principal component, but films of gold or titanium, or of an alloy having one of these metals as the principal component, are also employed.

Figure 3:
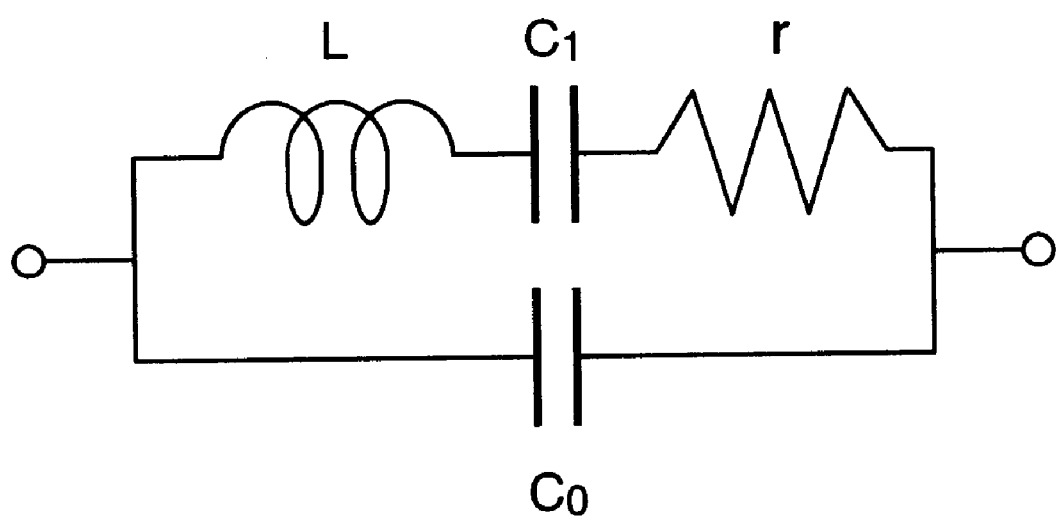
FIG. 3 is an equivalent electrical circuit diagram of the prior art SAW resonator in FIG. 1.
Figure 4:
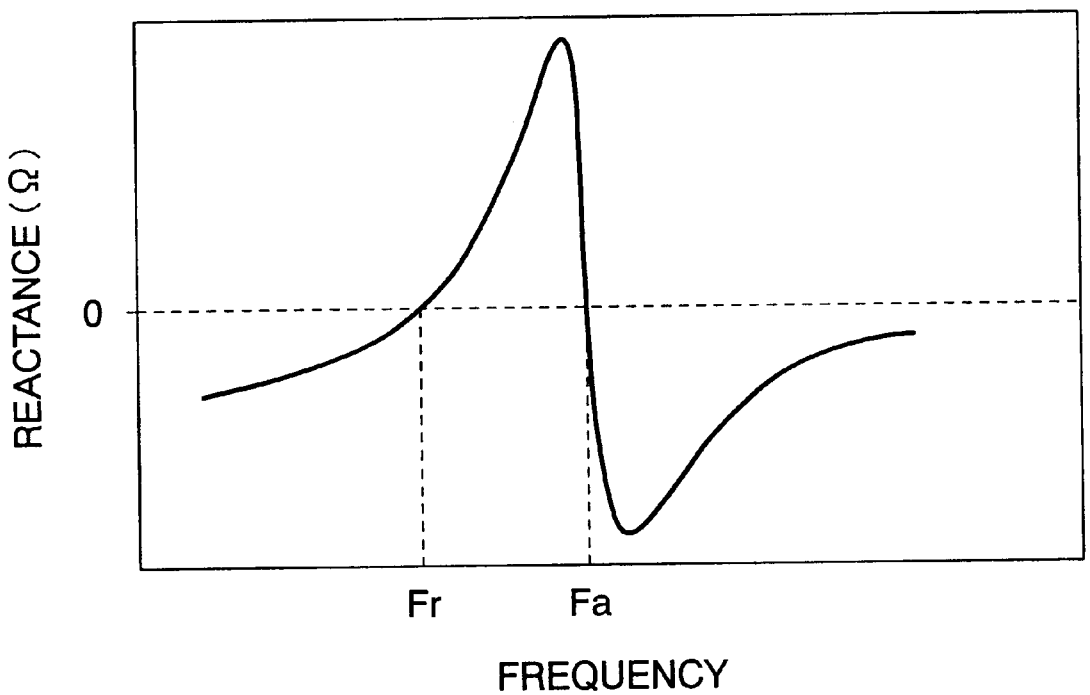
FIG. 4 illustrates the reactance characteristic of the equivalent circuit in prior art FIG. 3.

FIG. 3 shows an equivalent LC circuit commonly used to approximate the characteristics of the SAW resonator 10. The circuit comprises an inductor L, a capacitor $C_1$, and a resistor r coupled in series, and another capacitor $C_0$ coupled in parallel with the L, $c_1$, and r elements. This circuit has the reactance characteristic shown in FIG. 4, in which frequency is indicated on the horizontal axis, and reactance on the vertical axis. Fr is the resonant frequency, and Fa is the antiresonant frequency. The reactance is zero ohms (0Ω) at both Fr and Fa. The design of electrical filters from elements having this type of reactance characteristic is a well-established art.

Figure 5A:
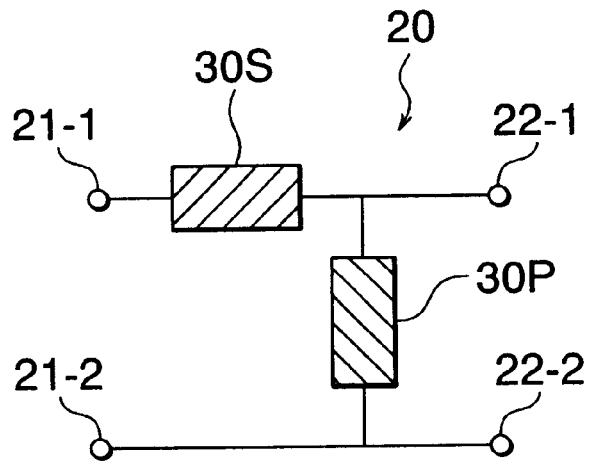
FIGS. 5A and 5B show two prior art single-stage resonator-type filters with ladder network configurations.
Figure 5B:
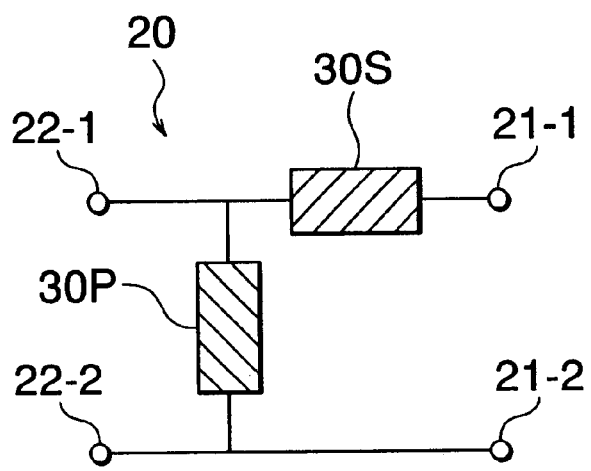

FIGS. 5A and 5B show two basic filter configurations using resonators of the above type. Both filters are two-port single-stage ladder networks 20 with terminals 21-1 and 21-2 forming one port and terminals 22-1 and 22-2 forming another port. One port is the input port; the other port is the output port. A series-arm resonator 30S is coupled between terminals 21-1 and 22-1. A shunt-arm resonator 30P is coupled between terminals 22-1 and 22-2. The impedance seen from the terminals 21-1, 21-2 on the left of the filter in FIG. 5A is equal to the impedance seen from the terminals 21-1, 21-2 on the right of the filter in FIG. 5B, and the impedance seen from the terminals 22-1, 22-2 on the right of the filter in FIG. 5A is equal to the impedance seen from the terminals 22-1, 22-2 on the left of the filter in FIG. 5B. These impedance equalities are significant when filter sections with the configurations shown in FIGS. 5A and 5B are cascaded to form a multiple-stage filter.

If the antiresonant frequency of the shunt-arm resonator 30P is substantially equal to the resonant frequency of the series-arm resonator 30S, the single-stage ladder network shown in FIG. 5A or FIG. 5B functions as a bandpass filter. This condition also leads to good impedance matching between the: input port and the output port.

Figure 6:
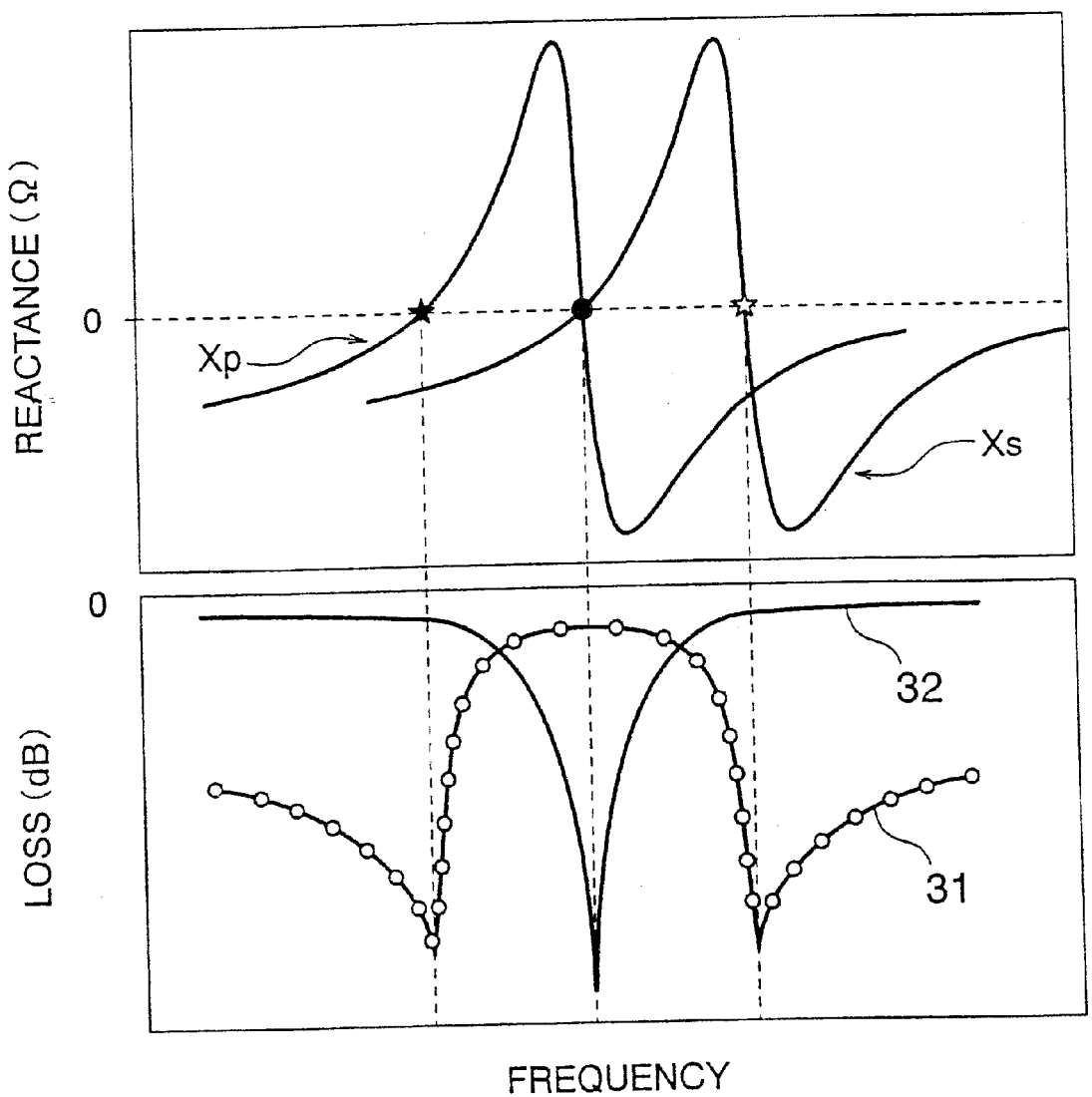
FIG. 6 shows reactance and loss characteristic of the filters in prior art FIGS. 5A and 5B.

FIG. 6 shows the reactance characteristics of the resonators 30P and 30S and the loss characteristics of the ladder networks in FIGS. 5A and 5B when this condition is met. Frequency is shown on the horizontal axis, reactance (in ohms) on the upper part of the vertical axis, and loss (in decibels) on the lower part of the vertical axis. In the upper part of the graph, Xp denotes the reactance characteristic of the shunt-arm resonator 30P, and Xs denotes the reactance characteristic of the series-arm resonator 30S. The black star denotes the resonant frequency of the shunt-arm resonator 30P. The black dot denotes the antiresonant frequency of the shunt-arm resonator 30P, which is also the resonant frequency of the series-arm resonator 30S. The white star denotes the antiresonant frequency of the series-arm resonator 30S. In the lower part of the graph, the curve 31 adorned with white dots is the insertion loss characteristic, and the unadorned curve 32 is the reflection loss characteristic. The insertion loss characteristic 31 is that of a bandpass filter with a passband extending above and below the resonant frequency of the series-arm resonator 30S.

If the number of stages in the ladder network is increased, the attenuation in the upper and lower stopbands increases, but the insertion loss in the passband also increases. The number of stages is accordingly determined by the required filter characteristics. As the number of stages increases, the number of resonators 30P and 30S increases proportionally.

Figure 7:
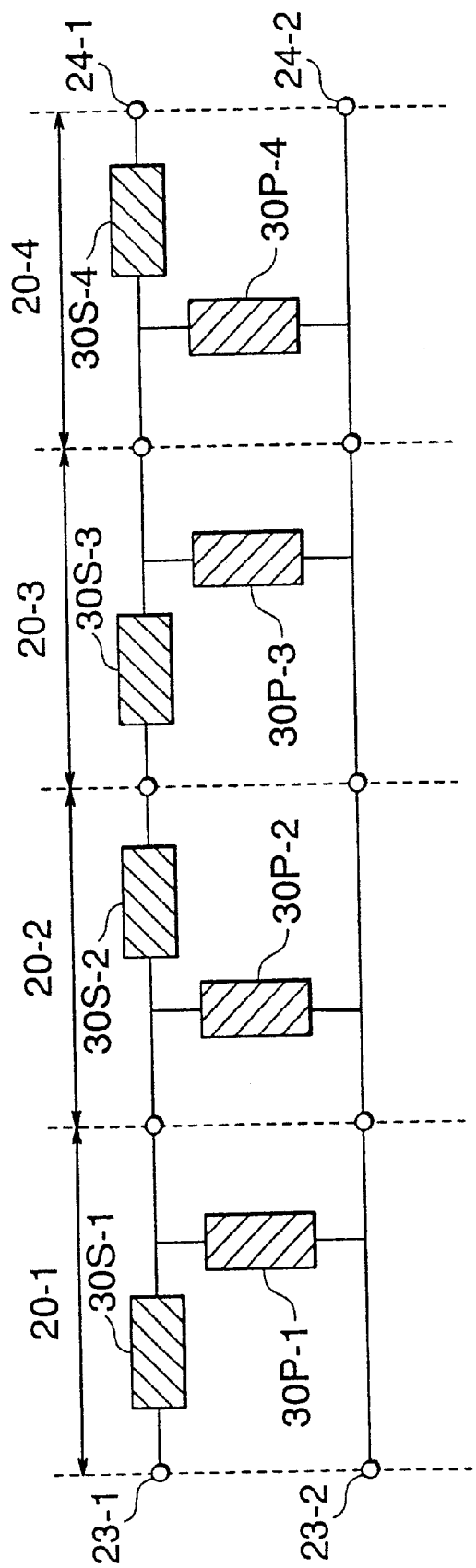
FIG. 7 shows a conventional four-stage resonator-type filter with a ladder network configuration.

FIG. 7 shows a preliminary design of a conventional four-stage resonator-type ladder filter. This design cascades four ladder stages 20-n of the type shown in FIGS. 5A and 5B, each stage 20-n comprising a shunt-arm resonator 30P-n and a series-arm resonator 30S-n (n=1, 2, 3, 4). As shown, the design requires eight resonators. Terminals 23-1 and 23-2 form the input port; terminals 24-1 and 24-2 form the output port. Terminals 23-2 and 24-2 are coupled to ground.

To prevent signal reflection between stages, the stages are arranged so that terminals with equal impedance are interconnected. As a result, series-arm resonators 30S-2 and 30S-3 are coupled in series at the same point in the ladder network. Similarly, shunt-arm resonators 30P-1 and 30P-2 are coupled in parallel at the same point; likewise, shunt-arm resonators 30P-3 and 30P-4 are coupled in parallel at the same point.

Two adjacent resonators that are coupled in series or parallel can generally be combined into a single resonator having substantially the same impedance characteristics as the series or parallel circuit made up of the two resonators. Such combinations reduce the filter in FIG. 7 to the configuration shown in FIG. 8, having only five resonators. Resonator 40P-1 in FIG. 8 is equivalent to the combination of resonators 30P-1 and 30P-2 in FIG. 7; resonator 40P-2 in FIG. 8 is equivalent to the combination of resonators 30P-3 and 30P-4 in FIG. 7; resonator 40S-2 in FIG. 8 is equivalent to the combination of resonators 30S-2 and 30S-3 in FIG. 7; and resonators 40S-1 and 40S-3 in FIG. 8 are the same as resonators 30S-1 and 30S-4 in FIG. 7.

Figure 8:
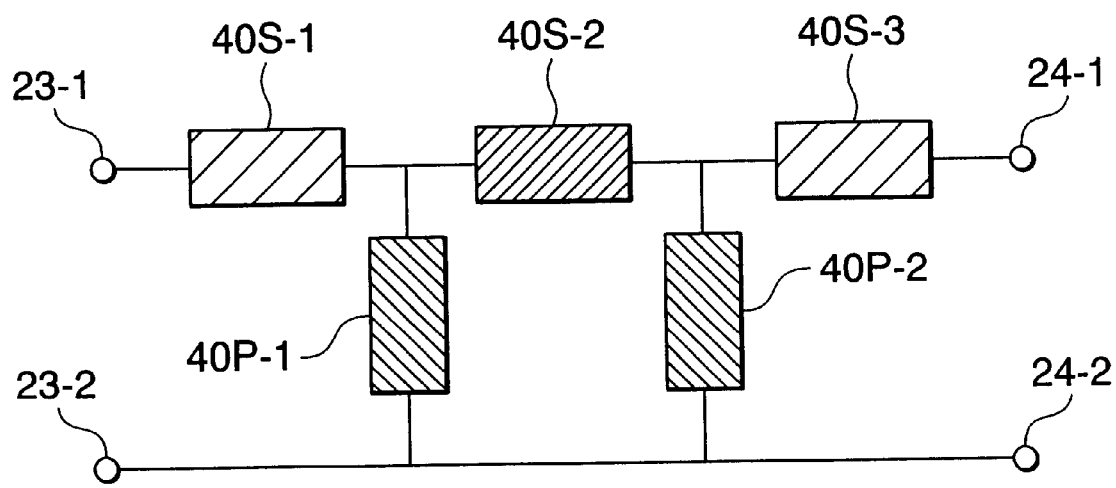
FIG. 8 shows another conventional four-stage resonator-filter with a ladder network configuration.
Figure 9:
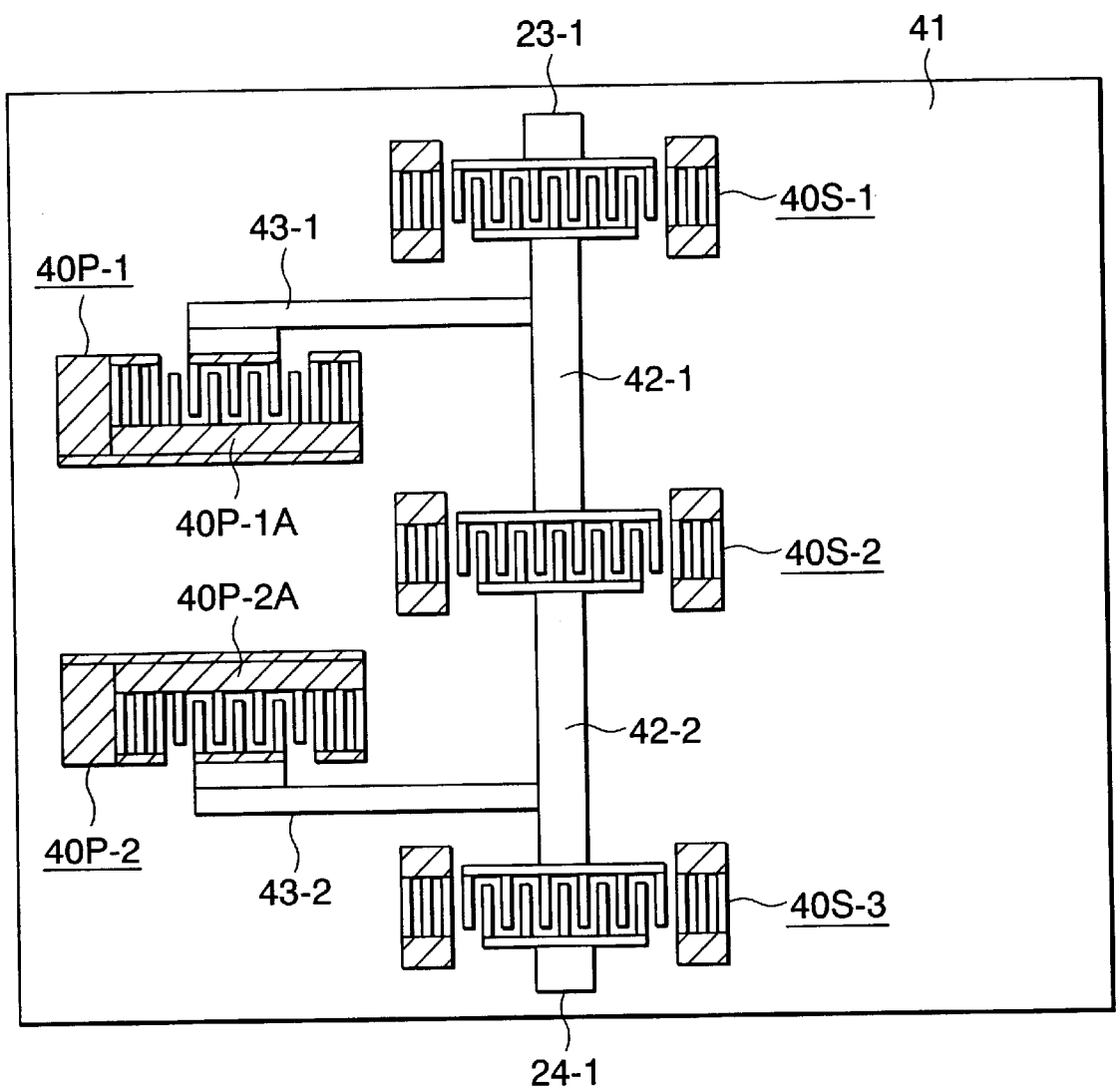
FIG. 9 is a plan view of a conventional resonator-type SAW filter having the circuit configuration shown in FIG. 8.

FIG. 9 shows a realization of the four-stage ladder network in FIG. 8 as a SAW filter comprising resonators 40S-1, 40S-2, 40S-3, 40P-1, 40P-2 formed on a piezoelectric substrate 41. Input terminal 23-1 is coupled to series-arm resonator 40S-1. Series-arm resonator 40S-1 is coupled by a transmission-line pattern 42-1 to series-arm resonator 40S-2, and by another transmission-line pattern 43-1 to shunt-arm resonator 40P-1. Series-arm resonator 40S-2 is coupled by a transmission-line pattern 42-2 to series-arm resonator 40S-3, and by another transmission-line pattern 43-2 to shunt-arm resonator 40P-2. Series-arm resonator 40S-3 is coupled to the output terminal-24-1.

The reflectors of the resonators 40S-1, 40S-2, 40S-3, 40P-1, 40P-2 are generally grounded to improve device characteristics, by preventing the accumulation of static charge, for example. The reflectors can be grounded by wire bonding. To simplify packaging, the reflectors of the shunt-arm resonators 40P-1 and 40P-1 are conventionally grounded through the same bonding wires as the ground terminals of these resonators. Shunt-arm resonator 40P-1 accordingly has a single thin-film ground pattern 40P-1A joined to its interdigital transducer and both of its reflectors, this pattern 40P-1A serving as a bonding pad for a single bonding wire. Similarly, shunt-arm SAW resonator 40P-2 has a single thin-film ground pattern 40P-2A joined to its interdigital transducer and both reflectors, this pattern 40P-2A also serving as a bonding pad for a single bonding wire.

The out-of-band attenuation of a SAW filter of this resonator type, with a four-stage ladder network, is about twenty-eight to thirty decibels (28 dB to 30 dB). If higher attenuation is needed, further stages must be added, but the insertion loss in the passband increases in proportion to the number of stages. When a resonator-type SAW filter is used in an application requiring low insertion loss in the passband, the conventional practice has been to sacrifice out-of-band attenuation by reducing the number of stages of the ladder network. Conversely, when a resonator-type SAW filter is used in an application requiring high out-of-band attenuation, the conventional practice has been to sacrifice passband insertion loss by increasing the number of stages.

Figure 10:
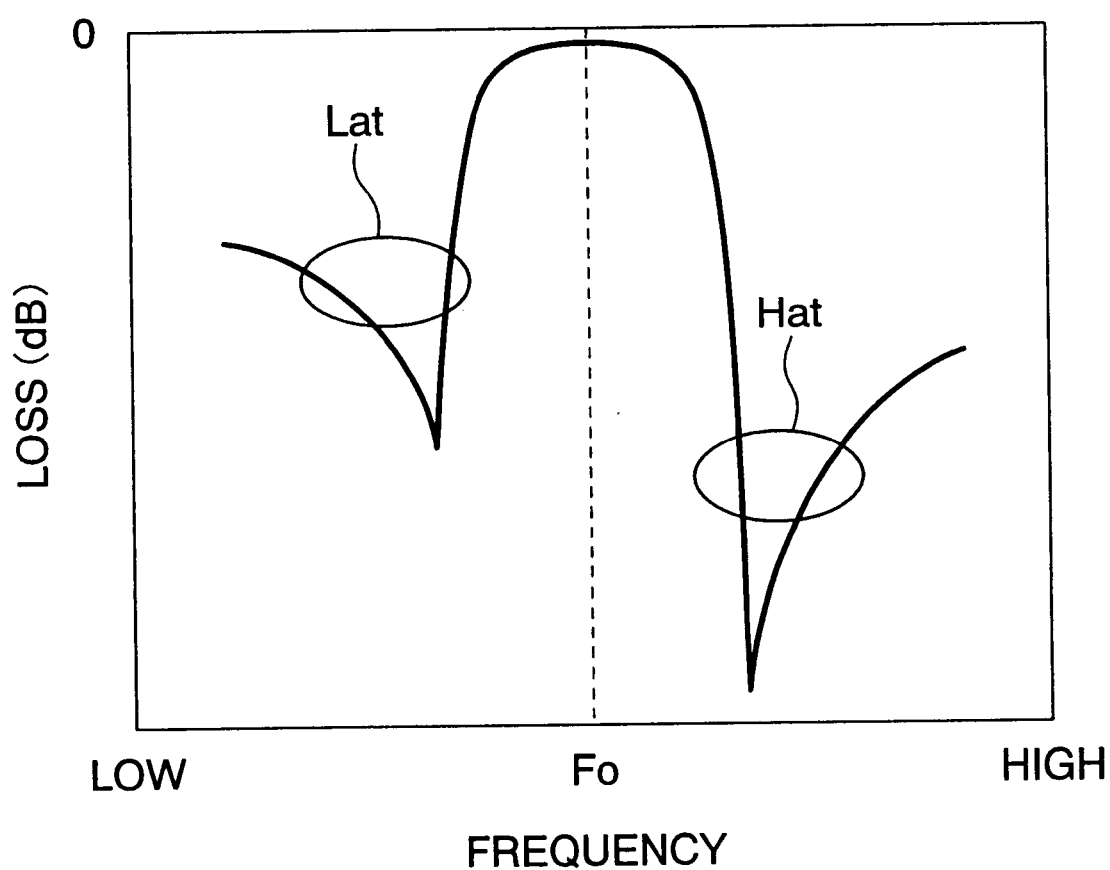
FIG. 10 shows the insertion-loss characteristic of the conventional SAW filter in FIG. 9.

FIG. 10 shows the insertion-loss characteristic of the four-stage resonator-type SAW filter in FIG. 9. Theory predicts that the shunt-arm resonators 40P-1, 40P-2 should have most effect on this characteristic in the region below the center frequency $F_0$. Experience has shown that when the interdigital transducers and reflectors of the shunt-arm resonators 40P-1, 40P-2 are grounded through common ground patterns 40P-1A, 40P-2A and common bonding wires, the attenuation level Lat on the low side is much less than the attenuation level Hat on the high side. A desirable goal is to bring the low-side attenuation level Lat up to the high-side attenuation level Hat.

There is room for improvement in many of the performance characteristics of resonator-type SAW filters, but lower loss (lower insertion loss in the passband), higher out-of-band attenuation, and higher power ratings are among the most important needs. Lowering the passband insertion loss is extremely important, but equal importance is attached to raising the out-of-band attenuation. As noted above, the conventional method of raising the out-of-band attenuation is to increase the number of stages in the ladder network, but this unavoidably increases the passband insertion loss, thereby failing to produce a high-performance filter.

Japanese Unexamined Patent Application No. 10-294640 proposes an improved method of connecting the ground electrode pads of the interdigital transducers of the shunt-arm SAW resonators to the ground terminals of the package, to improve the high-side attenuation Hat. This method does not, however, offer a way to increase the low-side attenuation Lat without altering the insertion loss in the passband.

Figure 11:
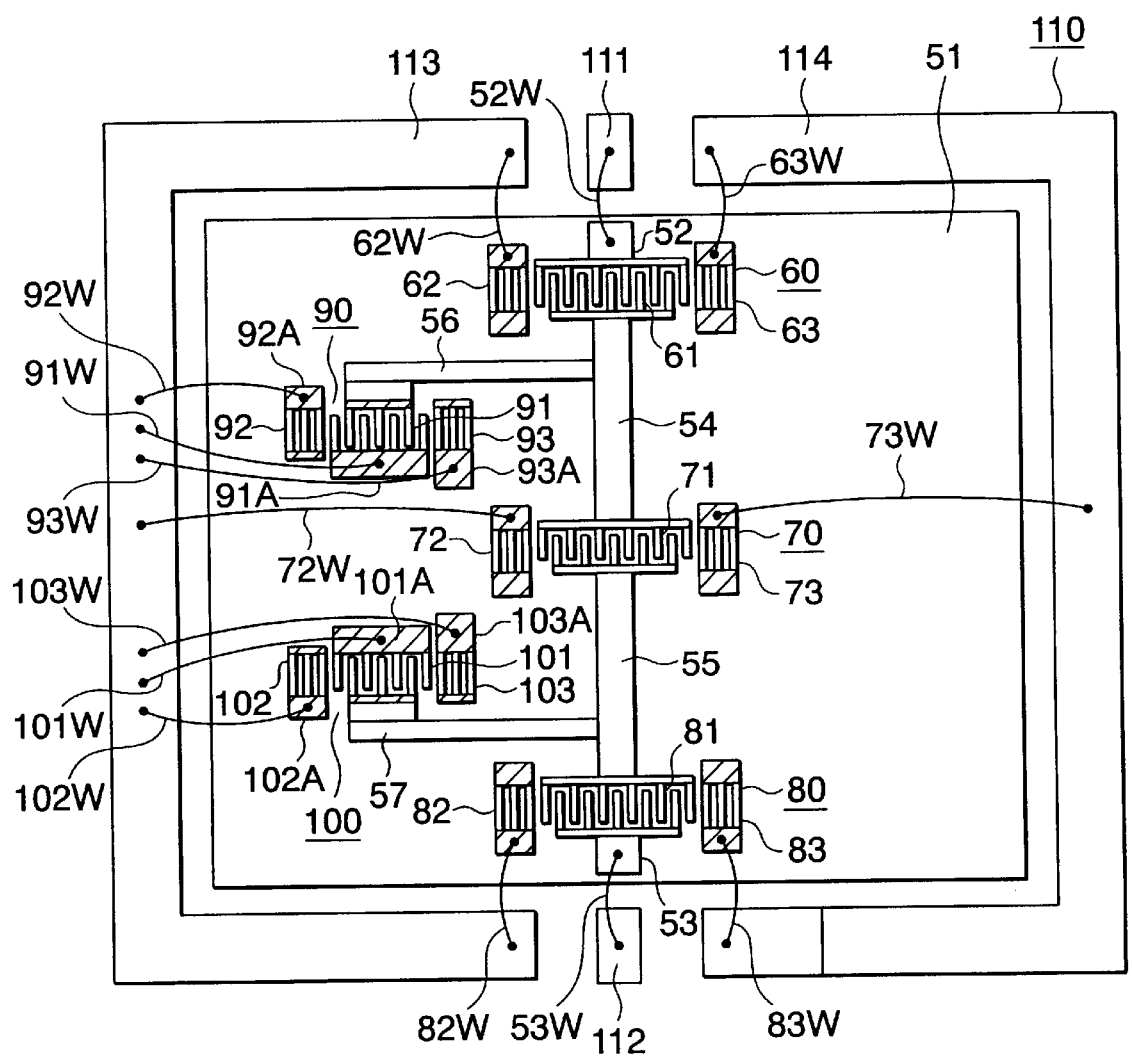
FIG. 11 is a plan view of a resonator-type SAW filter embodying the invention.

The present invention uses a novel grounding scheme to mitigate the problem of inadequate low-side attenuation. A first embodiment of the invention, shown in FIG. 11, is a resonator-type SAW filter that has a piezoelectric substrate 51 such as an LiTaO$_3$, LiNbO$_3$, or crystalline quartz substrate, on which are formed an input terminal 52, an output terminal 53, thin-film transmission-line patterns 54, 55, 56, 57, series-arm SAW resonators 60, 70, 80, and shunt-arm SAW resonators 90, 100. Series-arm SAW resonator 60 is coupled to the input terminal 52 and by transmission line 54 to series-arm SAW resonator 70. Series-arm SAW resonator 70 is coupled by transmission line 55 to series-arm SAW resonator 80, which is coupled to the output terminal 53. Shunt-arm SAW resonator 90 is coupled by transmission line 56 to transmission line 54. Shunt-arm SAW resonator 100 is coupled by transmission line 57 to transmission line 55.

The series-arm SAW resonators 60, 70, 80 have respective interdigital transducers 61, 71, 81 with first reflectors 62, 72, 82 on the left sides thereof in the drawing and second reflectors 63, 73, 83 on the right sides. The shunt-arm SAW resonators 90, 100 have generally similar structures with interdigital transducers 91, 101, first reflectors 92, 102, and second reflectors 93, 103. These structures are generally similar to the conventional SAW resonator structures shown in FIGS. 1 and 2B, with a separation 'd' between the interdigital transducers and reflectors.

The shunt-arm resonators 90 and 100 have ground patterns that serve, in the first embodiment, as bonding pads. Differing from the conventional device shown in FIG. 9, instead of a single ground pattern to which the interdigital transducer and both reflectors are connected, each shunt-arm SAW resonator has three independent ground patterns. Ground patterns 91A, 101A are connected to respective interdigital transducers 91, 101. Ground patterns 92A, 102A are connected to respective first reflectors 92, 102. Ground patterns 93A, 103A are connected to respective second reflectors 93, 103. On the substrate 51, these ground patterns or bonding pads 91A, 92A, 93A, 101A, 102A, 103A are electrically isolated from one another. The series-arm SAW resonators 60, 70, 80 also have independent ground patterns serving as bonding pads for each of their reflectors.

The underside of the substrate 51 is attached, by an adhesive, for example, to a package 110 in which the SAW filter is enclosed. The package has an input lead 111 for input of a high-frequency signal such as a radio-frequency signal, an output lead 112 for output of an output signal, and two ground leads 113, 114. The input lead 111 is coupled by a bonding wire 52W to the input terminal 52. The output lead 112 is coupled by a bonding wire 53W to the output terminal 53. Ground lead 113 is coupled by bonding wires 62W, 72W, 82W to the bonding pads of the first reflectors 62, 72, 82 of the series-arm SAW resonators. Ground lead 114 is coupled by bonding wires 63W, 73W, 83W to the bonding pads of the second reflectors 63, 73, 83 of the series-arm SAW resonators.

Ground lead 113 is also coupled, by three independent bonding wires 91W, 92W, 93W to the three bonding pads 91A, 92A, 93A of shunt-arm SAW resonator 90, and by three more independent bonding wires 101W, 102W, 103W to the three bonding pads 101A, 102A, 103A of shunt-arm SAW resonator 100. The use of independent bonding pads and independent bonding wires for the interdigital transducer and reflectors of each shunt-arm SAW resonator is a feature distinguishing the present invention from the conventional SAW filter shown in FIG. 9.

Figure 12:
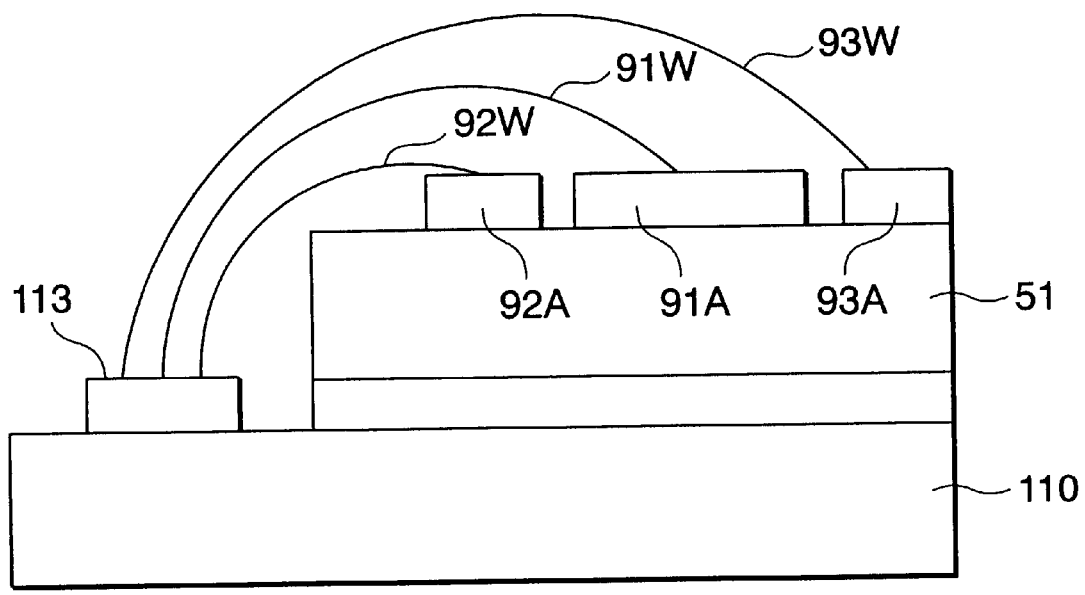
FIG. 12 is a partial sectional view of the SAW filter in FIG. 11.

FIG. 12 is a schematic sectional view showing the package 110, substrate 51, ground lead 113, bonding pads 91A, 92A, 93A, and bonding wires 91W, 92W, 93W. These bonding wires and the other bonding wires 52W, 53W, 62W, 63W, 72W, 73W, 82W, 83W, 101W, 102W, 103W in FIG. 11 are fine strands of a metal conductor such as aluminum or gold.

The first embodiment operates as follows. A high-frequency signal supplied to the input lead 111 of the package 110 is conducted by bonding wire 52W to the input terminal 52 on the substrate 51, and generates voltage differentials between the electrode fingers of the interdigital transducers 61, 71, 81, 91, 101 of the SAW resonators 60, 70, 80, 90, 100, thereby exciting acoustic waves. Surface acoustic waves that leak from the right and left sides of the interdigital transducers 61, 71, 81, 91, 101 are acoustically reflected by the reflectors 62, 63, 72, 73, 82, 83, 92, 93, 102, 103. The SAW resonators 60, 70, 80, 90, 100 display impedance characteristics similar to those of a crystal resonator or an LC resonator, and the ladder network as a whole behaves with the characteristics of a bandpass filter. Signal components with frequencies in the passband are output from the output terminal 53 on the substrate 51 with little loss, and are conducted by bonding wire 53W to the output lead 112. Other signal components are attenuated.

Figure 13:
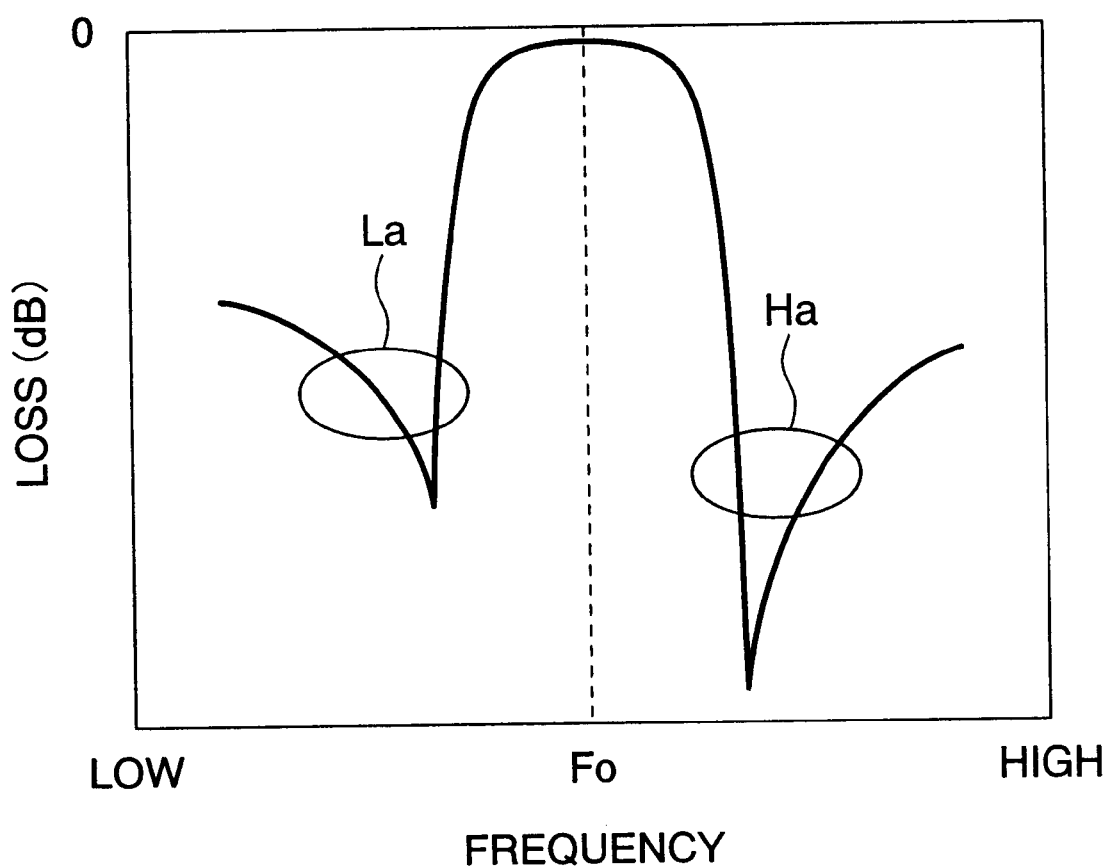
FIG. 13 shows the insertion-loss characteristic of the SAW filter in FIG. 11.

FIG. 13 shows the insertion-loss characteristic of the first embodiment. Compared with FIG. 10, attenuation in the passband and on the high side of the passband is the same, but the attenuation on the low side of the passband is enhanced. The enhancement is thought to be due to the markedly improved isolation of the shunt-arm SAW resonators 90, 100, which have the greatest effect on the insertion-loss characteristic on the low side. The improved isolation is due to the complete separation of the ground patterns 91A, 101A of the interdigital transducers 91, 101 of the shunt-arm SAW resonators 90, 100 from the first-reflector ground patterns 92A, 102A and the second-reflector ground patterns 93A, 103A, and to the use of independent bonding wires 91W, 101W, 92W, 102W, 93W, 103W to couple each ground pattern to the ground lead 113 of the package 110. Although a theoretical explanation for the improved attenuation cannot be given at present, the effect is thought to involve the stray capacitance of the ground patterns 91A, 92A, 93A, 101A, 102A, 103A.

The low-side attenuation La and high-side attenuation Ha in FIG. 13 indicate the approximate attenuation levels obtained in the first embodiment. Compared with the low-side attenuation Lat in FIG. 10, La is increased by about four or five decibels (about 4 dB to 5 dB). This increase is attained without a corresponding increase in insertion loss in the passband because the number of stages of the ladder network remains the same.

Figure 14:
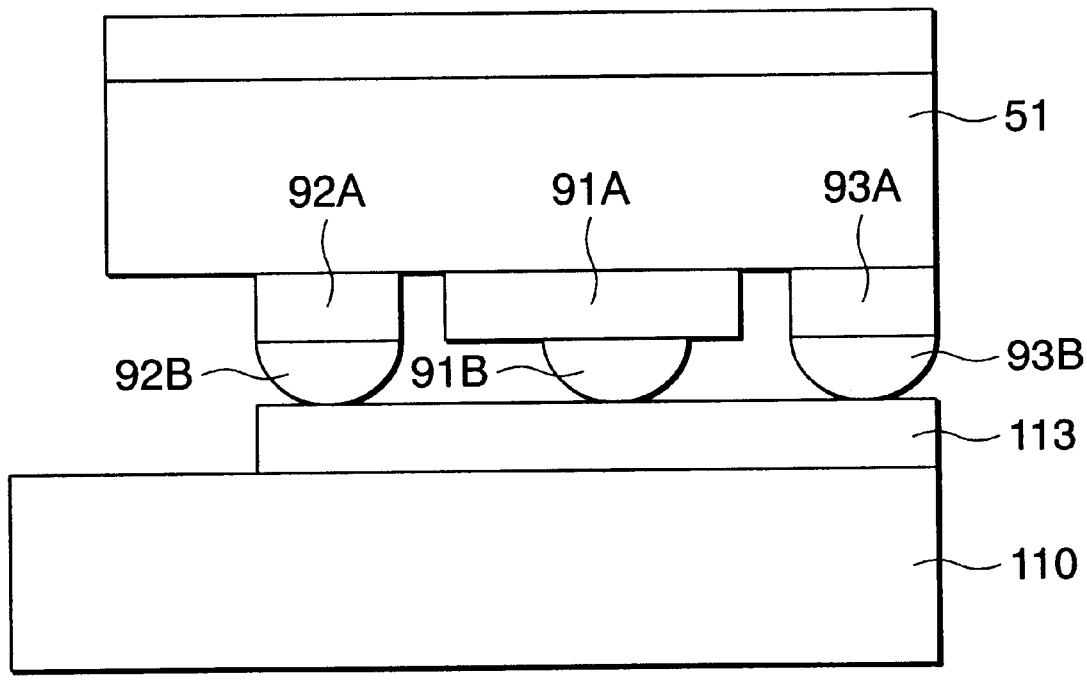
FIG. 14 is a partial sectional view of another resonator-type SAW filter embodying the invention.

In a second embodiment of the invention, the bonding wires of the first embodiment are replaced by conductive bumps such as solder bumps. FIG. 14 shows the conductive bumps 91B, 92B, 93B (see FIG. 11) coupling the ground patterns 91A, 92A, 93A of shunt-arm SAW resonator 90 to the ground lead 113 of the package 110. The ground patterns of the other SAW resonators are coupled to the appropriate leads by similar conductive bumps. The conductive bumps are formed on the respective ground patterns and are bonded by a soldering process, for example, to the appropriate leads. The same effect is obtained as in the first embodiment, but the interconnection process is simplified.

Figure 15:
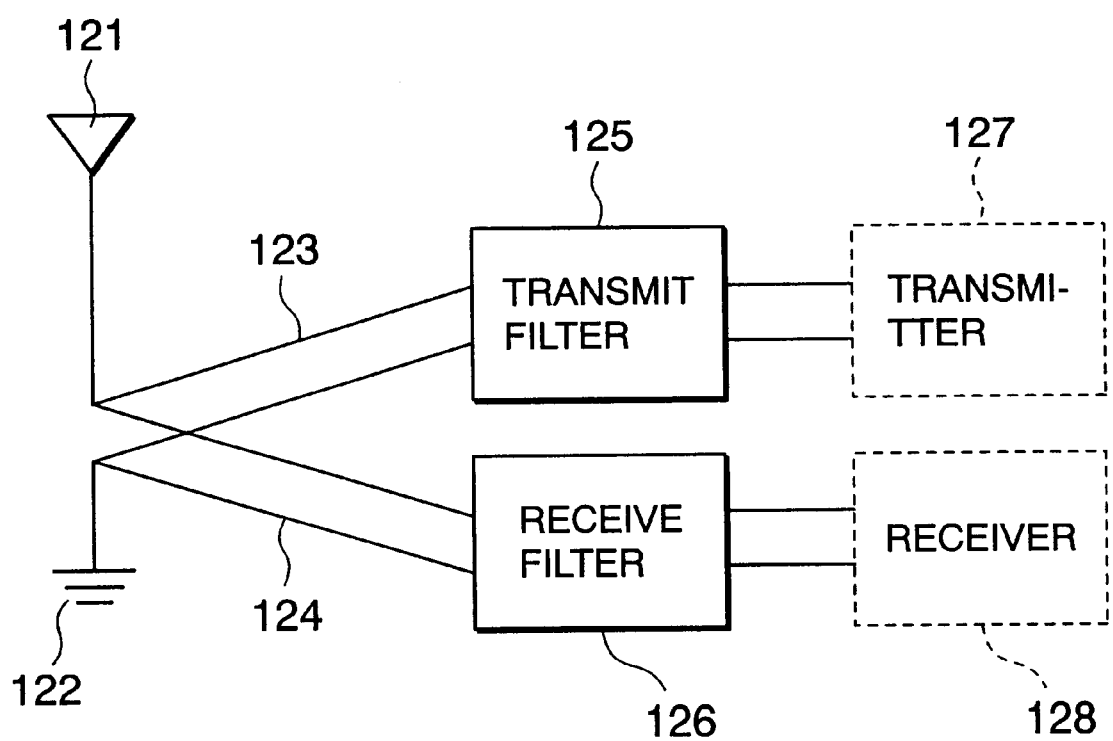
FIG. 15 is a schematic diagram of an antenna duplexer in which the invention can be employed.

The invented SAW filter can be usefully employed in the duplexer of a mobile telephone set such as an automobile-mounted telephone or a pocketsize telephone. Referring to FIG. 15, the duplexer couples an antenna 121 and ground 122 through transmission lines 123, 124 to a transmit filter 125 and a receive filter 126. The transmit filter 125 passes signals in one frequency band from a transmitter 127 to the antenna 121; the receive filter 126 passes signals in a different frequency band from the antenna to a receiver 128. Accordingly, the transmit filter 125 and receive filter 126 have different passbands. If the receive frequency is higher than the transmit frequency, the isolation between the transmitting circuits and the receiving circuits can be improved by increasing the low-side attenuation of the receive filter 126. The more this attenuation can be increased, the better. The present invention enables a desirable increase in attenuation to be obtained without an undesired insertion-loss penalty in the receive passband.

SAW filters are widely used as inter-stage filters in mobile telephones, but they have not been entirely satisfactory in duplexer applications, because of inadequate out-of-band attenuation. By improving the low-side attenuation La, the invention enables SAW filters to be used in a greater range of applications, including duplexers and other devices requiring strong low-side attenuation.

The invention is not limited to the embodiments described above. The following are a few of the many possible variations.

Ribbon bonding, employing aluminum or gold ribbons, for example, can be used in place of wire bonding.

The number of stages is not limited to four. There may be any number of stages, depending on the requirements of the application.

The physical configuration and layout of the series-arm resonators 60, 70, 80 and shunt-arm resonators 90, 100 is not limited to the configuration and layout shown in FIG. 11.

Many variations are possible in the shape and structure of the package 110.

Those skilled in the art will recognize that still further variations are possible within the scope claimed below.

What is claimed is:

1. A resonator-type. surface-acoustic-wave filter having a plurality of surface-acoustic-wave resonators with respective interdigital transducers and respective reflectors, each interdigital transducer being disposed between a respective pair of said reflectors, separated from the pair of reflectors by a certain distance, the surface-acoustic-wave resonators being coupled in a ladder network having at least one series-arm surface-acoustic-wave resonator and at least one shunt-arm surface-acoustic-wave resonator, the filter also having:

at least one ground lead;

a plurality of ground patterns, including a separate ground pattern connected to each said interdigital transducer of each said shunt-arm surface-acoustic-wave resonator and a separate ground pattern connected to each said reflector of each said shunt-arm surface-acoustic-wave resonator, said ground-patterns being electrically isolated from one another; and a plurality of conductors independently coupling said ground patterns to said at least one ground lead.

2. The resonator-type surface-acoustic-wave filter of claim 1, wherein said plurality of conductors are bonding wires.

3. The resonator-type surface-acoustic-wave filter of claim 1, wherein said plurality of conductors are conductive bumps.

4. The resonator-type surface-acoustic-wave filter of claim 1, further comprising a substrate on which both said surface-acoustic-wave resonators and said ground patterns are formed.

5. The resonator-type surface-acoustic-wave filter of claim 1, further comprising a package in which said at least one ground lead is mounted.

6. The resonator-type surface-acoustic-wave filter of claim 5, wherein said plurality of conductors are solder bumps, said package has an input lead and an output lead, and said resonator-type surface-acoustic-wave filter has an input terminal, an output terminal, a solder bump connecting the input terminal to the input lead, and another solder bump connecting the output terminal to the output lead.

7. A surface-acoustic-wave duplexer including a resonator-type surface-acoustic-wave filter having a lower stopband, a bandpass filter having a passband disposed in said lower stopband, and at least one ground lead, the resonator-type surface-acoustic-wave filter and the bandpass filter both being coupled to an antenna, one of the reasonator-type surface-acoustic-wave filter and the bandpass filter functioning as a transmit filter, another one of the resonator-type surface-acoustic-wave filter and the bandpass filter functioning as a receive filter, the resonator-type surface-acoustic-wave filter comprising:

a plurality of surface-acoustic-wave resonators with respective interdigital transducers and respective reflectors, each interdigital transducer being disposed between a respective pair of said reflectors, separated from the pair of reflectors by a certain distance, the surface-acoustic-wave resonators being coupled in a ladder network having at least one series-arm surface-acoustic-wave resonator and at least one shunt-arm surface-acoustic-wave resonator;

a plurality of ground patterns, including a separate ground pattern connected to each said interdigital transducer of each said shunt-arm surface-acoustic-wave resonator and a separate ground pattern connected to each said reflector of each said shunt-arm surface-acoustic-wave resonator, said ground patterns being electrically isolated from one another; and a plurality of conductors independently coupling said ground patterns to said at least one ground lead;

the electrical isolation of said plurality of ground patterns providing increased attenuation in said lower stopband.

8. The surface-acoustic-wave duplexer of claim 7, wherein said bandpass filter is also a surface-acoustic-wave filter.

9. The surface-acoustic-wave duplexer of claim 8, further comprising:

a piezoelectric substrate on which said resonator-type surface-acoustic-wave filter and said bandpass filter are formed; and a package in which said at least one ground lead is mounted, the package also having a plurality of signal leads; wherein said plurality of conductors are solder bumps; and said resonator-type surface-acoustic-wave filter and said bandpass filter futher comprise respective input terminals and output terminals, and respective solder bumps connecting said input terminals and said output terminals to the signal leads of said package.

10. The resonator-type surface-acoustic-wave filter of claim 9, further comprising a pair of transmission lines connected respectively to the resonator-type surface-acoustic-wave filter and the bandpass filter, the transmission lines having a common terminal directly connected to the antenna.

* * * * *